United States Patent
Jung et al.

(10) Patent No.: US 8,531,208 B2
(45) Date of Patent: Sep. 10, 2013

(54) FLIP-FLOP AND SEMICONDUCTOR DEVICE INCLUDING THE SAME

(75) Inventors: Gun Ok Jung, Yongin-si (KR); Min Su Kim, Hwaseong-si (KR); Uk Rae Cho, Suwon-si (KR); Dae Young Moon, Yongin-si (KR); Hyoung Wook Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/410,468

(22) Filed: Mar. 2, 2012

(65) Prior Publication Data

US 2012/0223739 A1   Sep. 6, 2012

(30) Foreign Application Priority Data

Mar. 4, 2011 (KR) .................. 10-2011-0019245

(51) Int. Cl.
*H03K 19/173* (2006.01)
(52) U.S. Cl.
USPC ................ 326/46; 326/95; 327/211; 714/731

(58) Field of Classification Search
USPC .............. 326/46, 16, 93, 95; 327/211, 202, 327/203, 212, 218; 714/731, 729, 726
See application file for complete search history.

(56) References Cited

U.S. PATENT DOCUMENTS

| | | | |
|---|---|---|---|
| 5,175,447 A * | 12/1992 | Kawasaki et al. | 327/211 |
| 6,006,348 A * | 12/1999 | Sode et al. | 714/731 |
| 6,496,030 B1 * | 12/2002 | Kaneko | 326/16 |
| 7,358,786 B2 | 4/2008 | Kim | |

FOREIGN PATENT DOCUMENTS

| | | |
|---|---|---|
| JP | 2005-328547 A | 11/2005 |
| JP | 2006-047013 A | 2/2006 |
| KR | 10-2005-0109365 A | 11/2005 |
| KR | 10-2010-0050933 A | 5/2010 |

* cited by examiner

*Primary Examiner* — Daniel D Chang
(74) *Attorney, Agent, or Firm* — Lee & Morse, P.C.

(57) ABSTRACT

A flip-flop is provided. The flip-flop includes a first latch circuit configured to latch a data signal in response to a plurality of first control signals or latch a scan input signal in response to a plurality of second control signals, and a second latch circuit configured to latch a signal output from the first latch circuit in response to complementary clock signals.

18 Claims, 11 Drawing Sheets

FIG. 10

| | TS(ps) | TCQ(ps) | TDQ(ps) |
|---|---|---|---|
| Conventional Art Flip-Flop | 34.04 | 81.93 | 115.98 |
| Exemplary Embodiment of Flip Flop | 23.79 | 68.28 | 92.07 |

FLIP-FLOP AND SEMICONDUCTOR DEVICE INCLUDING THE SAME

CROSS-REFERENCE TO RELATED APPLICATIONS

Korean Patent Application No. 10-2011-0019245, filed on Mar. 4, 2011, in the Korean Intellectual Property Office, and entitled: "Flip-Flop and Semiconductor Device Including the Same," is incorporated by reference herein in its entirety.

BACKGROUND

1. Field

Embodiments relate to a flip-flop, and more particularly, to a flip-flop supplying data at high speed by decreasing a signal transmission path and a semiconductor device including the same.

2. Description of the Related Art

A flip-flop is a memory element for storing and outputting data. The flip-flop is widely used in a semiconductor device. A semiconductor device needs the flip-flop providing the data at high speed.

SUMMARY

One or more embodiments provide a flip-flop providing data at high speed by decreasing a signal transmission path and a semiconductor device including the same.

One or more embodiments provide a flip-flop, including a first latch circuit configured to latch a data signal in response to a plurality of first control signals or latch a scan input signal in response to a plurality of second control signals, and a second latch circuit configured to latch a signal output from the first latch circuit in response to complementary clock signals.

The first latch circuit may include a first transmission circuit configured to invert the data signal in response to the plurality of first control signals, a second transmission circuit configured to invert the scan input signal in response to the plurality of second control signals, and a latch unit configured to latch one of an output signal of the first transmission circuit and an output signal of the second transmission circuit in response to the plurality of first control signals and the plurality of second control signals. The first transmission circuit and the second transmission circuit may be embodied in a tri-state inverter, respectively.

The latch unit may include a first tri-state inverter and a second tri-state inverter connected in parallel between an output terminal of the first transmission circuit and an output terminal of the second transmission circuit. The plurality of first control signals may be complementary to each other and the plurality of second control signals may be complementary to each other.

According to an example embodiment, the flip-flop further includes a control signal generator configured to generate the plurality of first control signals and the plurality of second control signals by performing a logic combination on one of the complementary clock signals and a scan enable signal.

The control signal generator may include a first control signal generator configured to generate the plurality of first control signals by performing a logic combination on the one of the complementary clock signals and the scan enable signal, and a second control signal generator configured to generate the plurality of second control signals by performing a logic combination on the one of the complementary clock signals and the scan enable signal.

According to an example embodiment, the first control signal generator and the second control signal generator may be embodied in a combination of a plurality of inverters and a plurality of NAND gates.

The first control signal generator may include a first inverter configured to invert the one of the complementary clock signals and output the other of the complementary clock signals, a second inverter configured to invert the scan enable signal, a NAND gate configured to perform a NAND operation on an output signal of the first inverter and an output signal of the second inverter, and a third inverter configured to invert an output signal of the first NAND gate. The second control signal generator includes a NAND gate configured to perform a NAND operation on the scan enable signal and the one of the complementary clock signals and an inverter inverting an output signal of the first NAND gate.

According to an example embodiment, the first control signal generator and the second control signal generator may be embodied in a combination of a plurality of inverters and a plurality of NOR gates.

The first control signal generator may include a first inverter configured to invert the one of the complementary clock signals, a second inverter configured to invert an output signal of the first inverter, a NOR gate configured to perform a NOR operation on the scan enable signal and an output signal of the second inverter, and a third inverter configured to invert an output signal of the NOR gate.

The second control signal generator may include a first inverter configured to invert the scan enable signal, a NOR gate configured to perform a NOR operation on the one of the complementary clock signals and an output signal of the first inverter, and a second inverter configured to invert an output signal of the NOR gate.

The second latch unit may include a tri-state inverter configured to receive the signal output from the first latch circuit, a latch unit configured to latch the signal output from the first latch circuit based on the complementary clock signals, and an inverter configured to invert the signal output from the latch unit.

The tri-state inverter may be configured to invert the signal output from the first latch circuit based on the complementary clock signals.

The latch unit may include an inverter and a tri-state inverter.

One or more embodiments provide a semiconductor device, including a flip-flop, and a logic circuit controlling the flip-flop, wherein the flip-flop includes a first latch circuit configured to latch a data signal in response to a plurality of first control signals and latch a scan input signal in response to a plurality of second control signals, and a second latch circuit configured to latch a signal output from the first latch circuit in response to complementary clock signals.

The first latch circuit may include a first transmission circuit configured to invert the data signal in response to the plurality of first control signals, a second transmission circuit configured to invert the scan input signal in response to the plurality of second control signals, and a latch unit configured to latch one of an output signal of the first transmission circuit and an output signal of the second transmission circuit in response to the plurality of first control signals and the plurality of second control signals.

One or more embodiments provide a flip-flop, including a first latch circuit configured to latch a data signal in response to a plurality of first control signals and latch a scan input signal in response to a plurality of second control signals, a second latch circuit configured to latch a signal output from the first latch circuit in response to complementary clock signals, and a driver configured to supply the first control signals, the second control signals and the complementary clock signals such that the first latch circuit and the second latch circuit are transparent during a same period of time.

The first latch circuit may include a first transmission circuit configured to invert the data signal in response to the plurality of first control signals, a second transmission circuit configured to invert the scan input signal in response to the plurality of second control signals, and a first latch unit configured to latch one of an output signal of the first transmission circuit and an output signal of the second transmission circuit in response to the plurality of first control signals and the plurality of second control signals, and the second latch circuit may include a tri-state inverter configured to receive the signal output from the first latch circuit, a second latch unit configured to latch the signal output from the first latch circuit based on the complementary clock signals, and an inverter configured to invert the signal output from the second latch unit, and the first latch circuit is transparent when the data signal passes only through the first transmission circuit of the first latch circuit, and the second latch circuit is transparent when the signal output from the first latch circuit passes only through the tri-state inverter.

BRIEF DESCRIPTION OF THE DRAWINGS

One or more features will become more apparent to those of ordinary skill in the art by describing in detail exemplary embodiments with reference to the attached drawings, in which:

FIG. 10 illustrates a table depicting a simulation result based on a conventional flip-flop and a simulation result of an exemplary embodiment of a flip-flop employing one or more features described herein.

DETAILED DESCRIPTION

Figure 1:
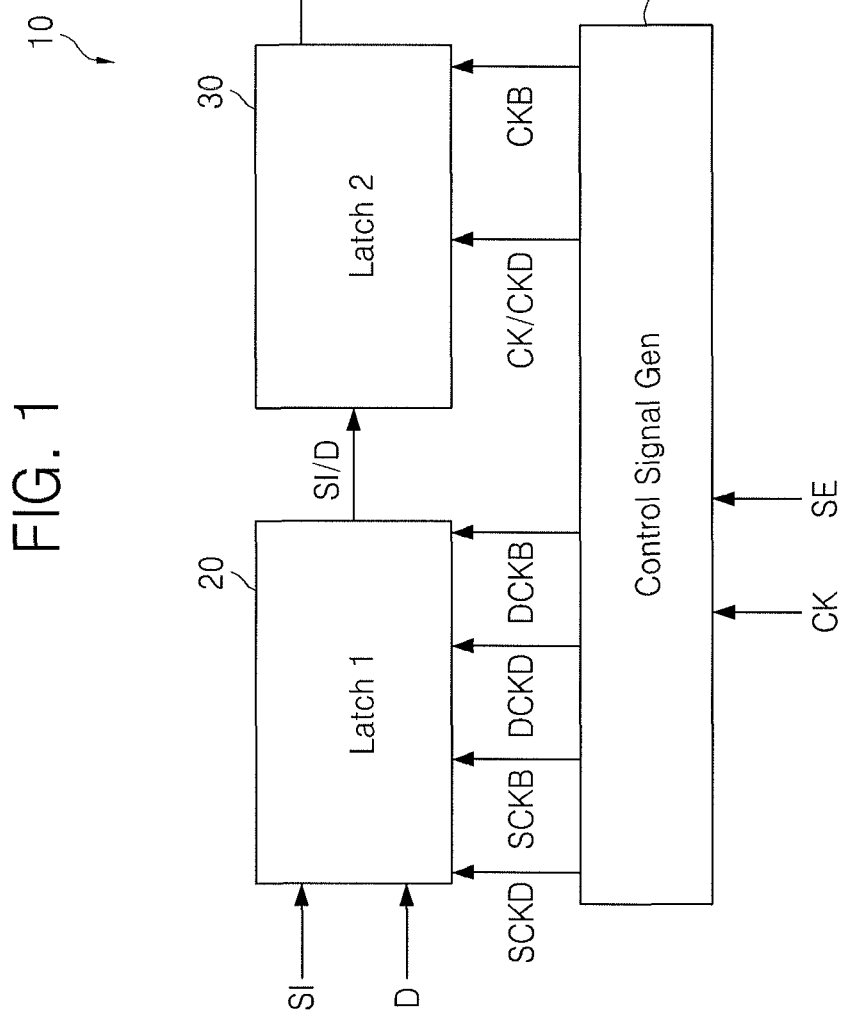
FIG. 1 illustrates a block diagram of an exemplary embodiment of a flip-flop.

Example embodiments now will be described more fully hereinafter with reference to the accompanying drawings, in which example embodiments are shown. Example embodiments may, however, be embodied in many different forms and should not be construed as limited to the embodiments set forth herein. Rather, these example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a block diagram of an exemplary embodiment of a flip-flop 10. Referring to FIG. 1, the flip-flop 10 may include a first latch circuit 20, a second latch circuit 30, and a control signal generator 40.

The first latch circuit 20 may latch a data signal D in response to a plurality of first control signals DCKD and DCKB and/or may latch a scan input signal SI in response to a plurality of second control signals SCKD and SCKB. The scan input signal SI is a signal for testing the flip-flop 10.

The second latch circuit 30 may latch the signal SI or D output from the first latch circuit 20 in response to complementary clock signals CK and CKB or CKD and CKB, and may output a latched signal QN.

The control signal generator 40 may generate the plurality of first control signals DCKD and DCKB and the plurality of second control signals SCKD and SCKB by performing a logic combination on a clock signal CK and a scan enable signal SE.

Figure 2:
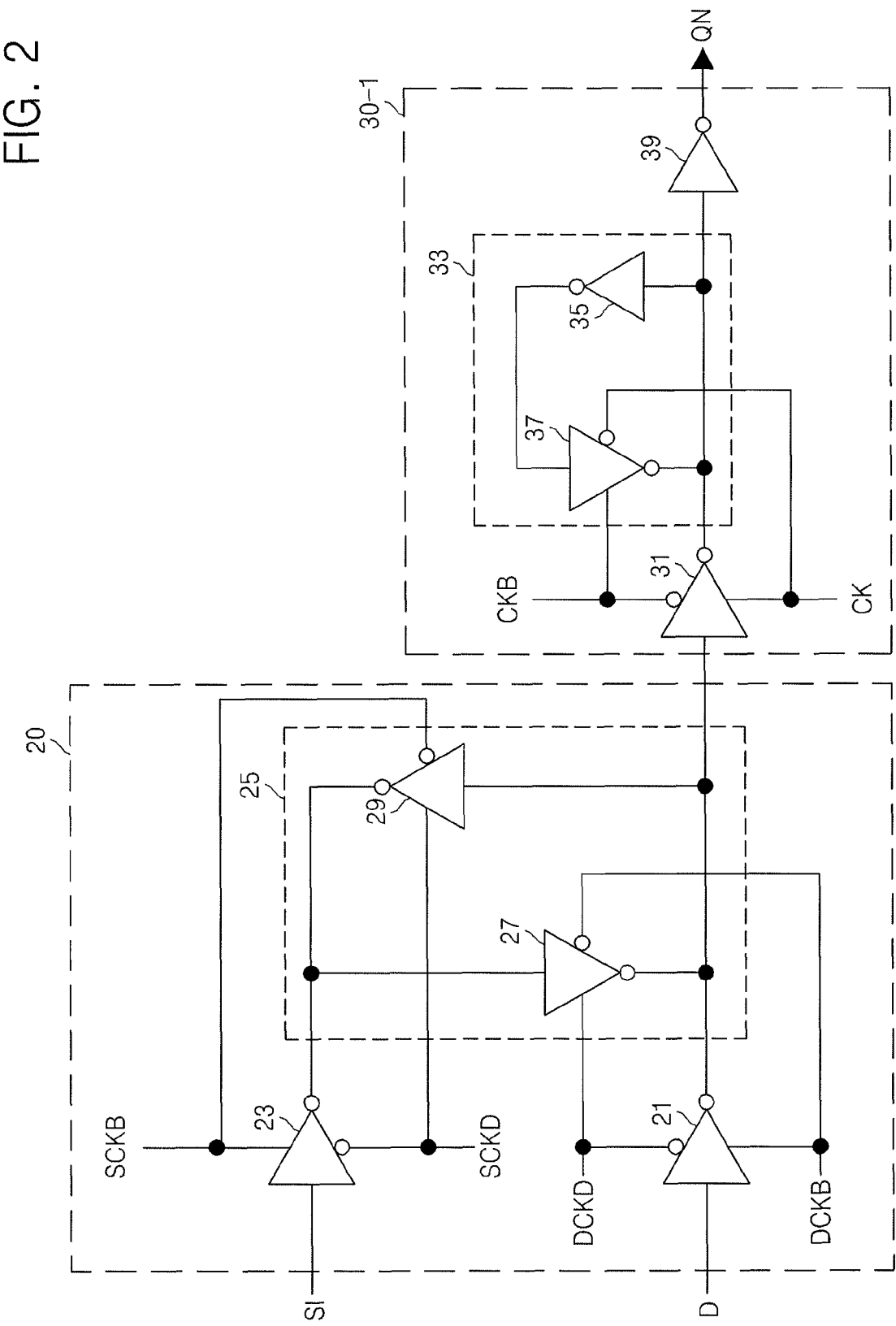
FIG. 2 illustrates a circuit diagram of exemplary embodiments of a first latch circuit and a second latch circuit.

FIG. 2 illustrates schematic diagrams of exemplary embodiments of the first latch circuit 20 and a second latch circuit 30-1 employable by the flip-flop 10 of FIG. 1.

Referring to FIG. 2, the first latch circuit 20 may include a first transmission circuit 21, a second transmission circuit 23, and a latch unit 25.

The first transmission circuit 21 may invert the data signal D in response to the plurality of first control signals DCKD and DCKB. The second transmission circuit 23 may invert the scan input signal SI in response to the plurality of second control signals SCKD and SCKB. The first transmission circuit 21 and the second transmission circuit 23 may include a tri-state inverter.

In embodiments in which the first transmission circuit 21 is embodied in a tri-state inverter, a data signal D is inverted when a control signal DCKB is high (logic 1), and an output terminal of the first transmission circuit 21 goes to a high impedance hi-Z state when the control signal DCKB is low (logic 0). In embodiments in which the second transmission circuit 23 is embodied in a tri-state inverter, the scan input signal SI is inverted when a control signal SCKB is high (logic 1), and an output terminal of the second transmission circuit 23 goes to a high impedance hi-Z state when the control signal SCKB is low (logic 0).

The latch unit 25 may latch one of an output signal of the first transmission circuit 21 and an output signal of the second transmission circuit 23 in response to the plurality of first control signals DCKD, DCKB and/or the plurality of second control signals SCKD, SCKB.

The latch unit 25 may include a first tri-state inverter 29 and a second tri-state inverter 27 connected in parallel between an output terminal of the first transmission circuit 21 and an output terminal of the second transmission circuit 23. An operation of the first tri-state inverter 29 is similar to an operation of the second transmission circuit 23. An operation of the second tri-state inverter 27 is similar to an operation of the first transmission circuit 21.

The second latch circuit 30-1 may include a tri-state inverter 31, a latch unit 33, and an inverter 39. The tri-state inverter 31 may invert the signal Si or D output from the first latch circuit 20 in response to the complementary clock signals CK and CKB. The latch unit 33 may latch the output signal SI or D of the tri-state inverter 31 in response to the complementary clock signals CK and CKB. The latch unit 33 may include an inverter 35 and a tri-state inverter 37. An operation of the tri-state inverter 37 is similar to an operation of the tri-state inverter 31.

Figure 3:
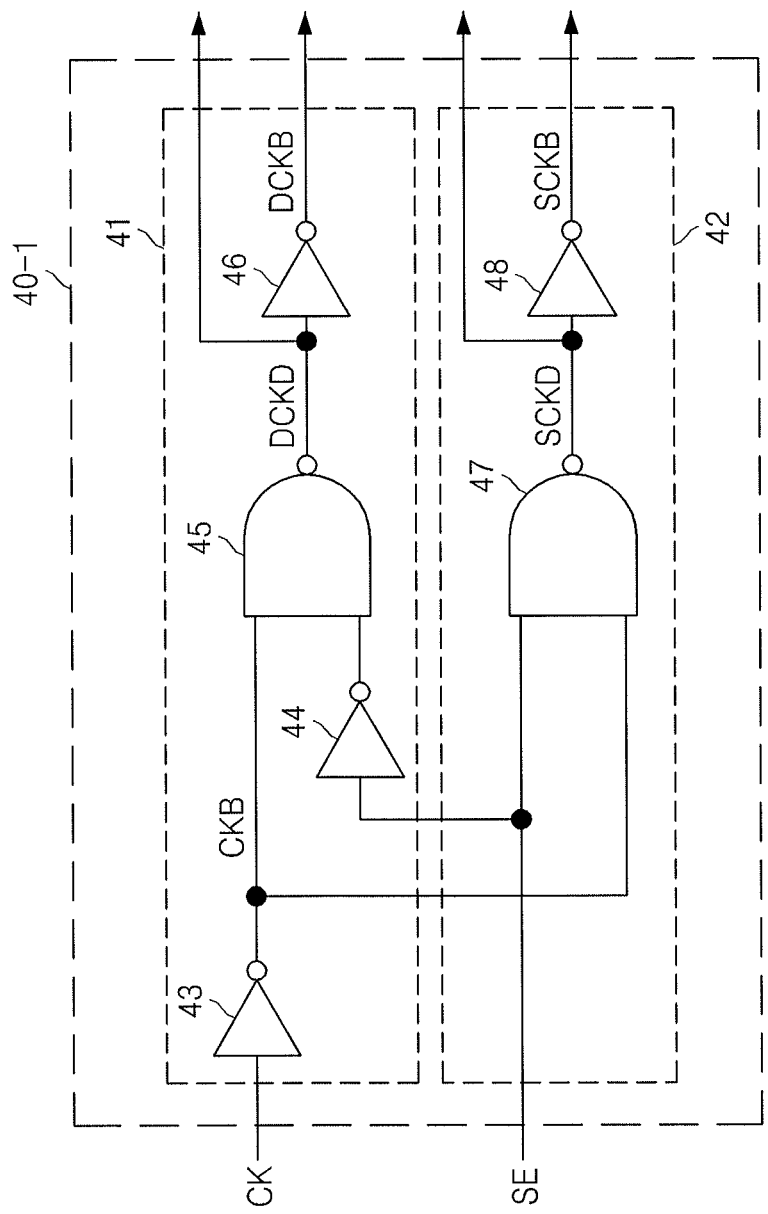
FIG. 3 illustrates a circuit diagram of an exemplary embodiment of a control signal generator.

FIG. 3 illustrates a circuit diagram of an exemplary embodiment of a control signal generator 40-1. Referring to FIGS. 1 and 3, the control signal generator 40-1 is an exemplary embodiment of the control signal generator 40 illustrated in FIG. 1. The control signal generator 40-1 may include a first control signal generator 41 and a second control signal generator 42.

The first control signal generator 41 may generate the plurality of first control signals DCKD, DCKB, which are complementary to each other, by performing a logical combination on the clock signal CK and the scan enable signal SE.

The first control signal generator 41 may include a plurality of inverters 43, 44, 46 and a NAND gate 45. The first inverter 43 may invert the clock signal CK and output an inversion clock signal CKB. The second inverter 44 may invert the scan enable signal SE. The NAND gate 45 may perform a NAND operation on the inversion clock signal CKB and an output signal of the second inverter 44. The third inverter 46 may invert the output signal DCKD of the NAND gate 45 and output the control signal DCKB.

The second control signal generator 42 may generate the plurality of second control signals SCKD, SCKB, which are complementary to each other, by performing a logic combination on one of the complementary clock signals (CKB) and the scan enable signal SE.

The second control signal generator 42 may include a NAND gate 47 performing a NAND operation on a scan enable signal SE and an inversion clock signal CKB and an inverter 48 inverting an output signal SCKD of the NAND gate 47.

Figure 4:
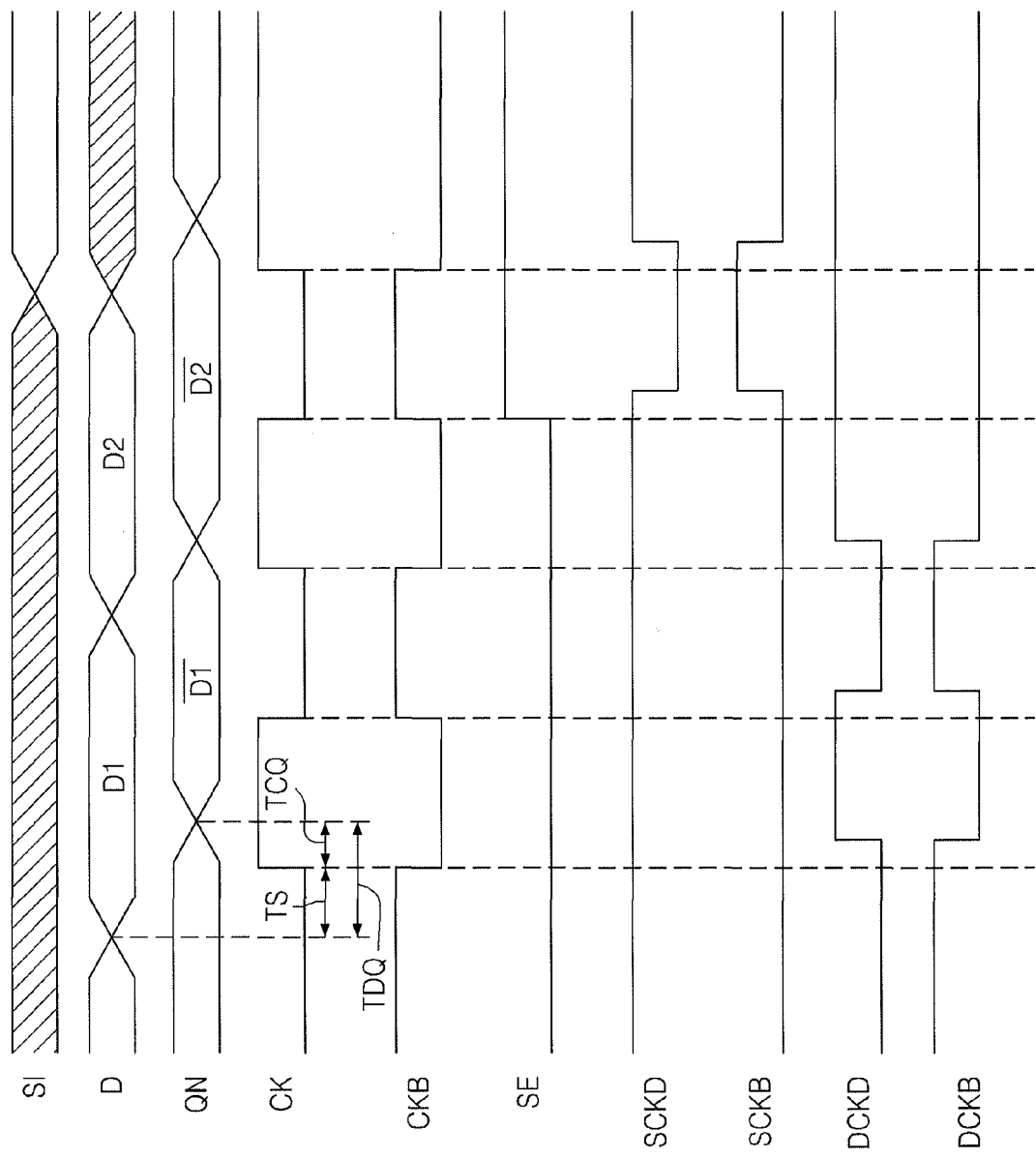
FIG. 4 illustrates a timing diagram of exemplary signals employable in an exemplary embodiment.

FIG. 4 illustrates a timing diagram of exemplary signals employable in an exemplary embodiment.

An inherent delay during operation of each element 43, 46 and 48 is not considered in a timing diagram illustrated in FIG. 4. Referring to FIGS. 1 to 4, when a scan enable signal SE is low (logic 0), the second control signal generator 42 generates a control signal SCKD which is high (logic 1) and a control signal SCKB which is low (logic 0) regardless of a level of the inversion clock signal CKB.

When the control signal SCKB is low (logic 0), an output terminal of the second transmission circuit 23 goes to a high impedance hi-Z state. Accordingly, the flip-flop 10 performs a normal operation. The normal operation is an operation that the flip-flop 10 latches a data signal D. The first tri-state inverter 29 inverts a data signal D output from the first transmission circuit 21.

When a scan enable signal SE is low (logic 0) and a clock signal CK is low (logic 0), the first control signal generator 41 generates a control signal DCKD which is low (logic 0) and a control signal DCKB which is high (logic 1).

When the control signal DCKB is high (logic 1), the first transmission circuit 21 inverts a data signal D and an output terminal of the second tri-state inverter 27 goes to a high impedance state. The first latch circuit 20 becomes transparent. Accordingly, a data signal D input to the first latch circuit 20 is transmitted to the second latch circuit 30-1 through the first transmission circuit 21. The data signal D is less delayed since it is transmitted to the second latch circuit 30-1 only through the first transmission circuit 21. Therefore, the flip-flop 10 may operate at high speed.

The second latch circuit 30-1 gets locked when a clock signal CK is low (logic 0). Accordingly, the second latch circuit 30-1 retains a logic (1 or 0) of the data signal D at a last rising edge of a clock signal CK less the clock signal CK transits from low (logic 0) to high (logic 1).

When a scan enable signal SE is low (logic 0) and a clock signal CK is high (logic 1), the first control signal generator 41 generates a control signal DCKD which is high (logic 1) and the control signal DCKB which is low (logic 0).

When the control signal DCKB is low (logic 0), an output terminal of the first transmission circuit 21 goes to a high impedance state and a tri-state inverter 27 inverts an output signal of the tri-state inverter 29. The first latch circuit 20 gets locked. Accordingly, the first latch circuit 20 retains a logic state (1 or 0) of the previous data signal D.

The second latch circuit 30-1 becomes transparent when the clock signal CK is high (logic 1). The second latch circuit 30-1 outputs a signal QN according to a logic state (1 or 0) of a data signal D output from the first latch circuit 20. For example, when the data signal D output from the first latch circuit 20 is high (logic 1), the signal QN is low (logic 0). When the data signal D output from the first latch circuit 20 is low (logic 0), the signal QN is high (logic 1).

As a result of a phase difference between the clock signal CK and the control signal DCKB, the clock signal CK and the control signal DCKB may overlap. For example, the clock signal CK and the control signal DCKB may be high at the same time. Accordingly, the first latch circuit 20 and the second latch circuit 30-1 may become transparent at the same time, so that the data signal D may be delivered at high speed.

When a scan enable signal SE is high (logic 1), the first control signal generator 41 generates a control signal DCKD which is high (logic 1) and a control signal DCKB which is low (logic 0) regardless of a level of the clock signal CK.

When the control signal DCKB is low (logic 0), an output terminal of the first transmission circuit 21 goes to a high impedance hi-Z state. Accordingly, the flip-flop 10 performs a scan test operation. The scan test operation is an operation for testing the flip-flop 10. In addition, the tri-state inverter 27 inverts a scan input signal SI output from the second transmission circuit 23.

When the scan enable signal SE is high (logic 1) and an inversion clock signal CKB is low (logic 0), the second control signal generator 42 generates a control signal SCKD which is high (logic 1) and a control signal SDKB which is low (logic 0).

When the control signal SCKB is low (logic 0), an output terminal of the second transmission circuit 23 goes to a high impedance state and the tri-state inverter 29 inverts an output signal of the tri-state inverter 27. The first latch circuit 20 gets locked. Therefore, the first latch circuit 20 retains a logic state (1 or 0) of a previous scan input signal SI.

The second latch circuit 30-1 becomes transparent when a clock signal CK is high (logic 1). Accordingly, the second latch circuit 30-1 outputs a signal QN according to a logic state (1 or 0) of a scan input signal SI output from the first latch circuit 20.

When the scan enable signal SE is high (logic 1) and the inversion clock signal CKB is high (logic 1), the second control signal generator 42 generates a control signal SCKD which is low (logic 0) and a control signal SCKB which is high (logic 1).

When the control signal SCKB is high (logic 1), the second transmission circuit 23 inverts a scan input signal SI and an output terminal of the tri-state inverter 29 goes to a high impedance state. The first latch circuit 20 becomes transparent. Accordingly, a scan input signal SI input to the first latch circuit 20 is transmitted to the second latch circuit 30-1 through the second transmission circuit 23 and the tri-state inverter 27.

The second latch circuit 30-1 becomes locked when the clock signal CK is low (logic 0). Accordingly, the second latch circuit 30-1 retains logic 1 or 0 of the scan input signal SI at the last rising edge of a clock signal CK until the clock signal CK transits from low (logic 0) to high (logic 1).

Figure 5:
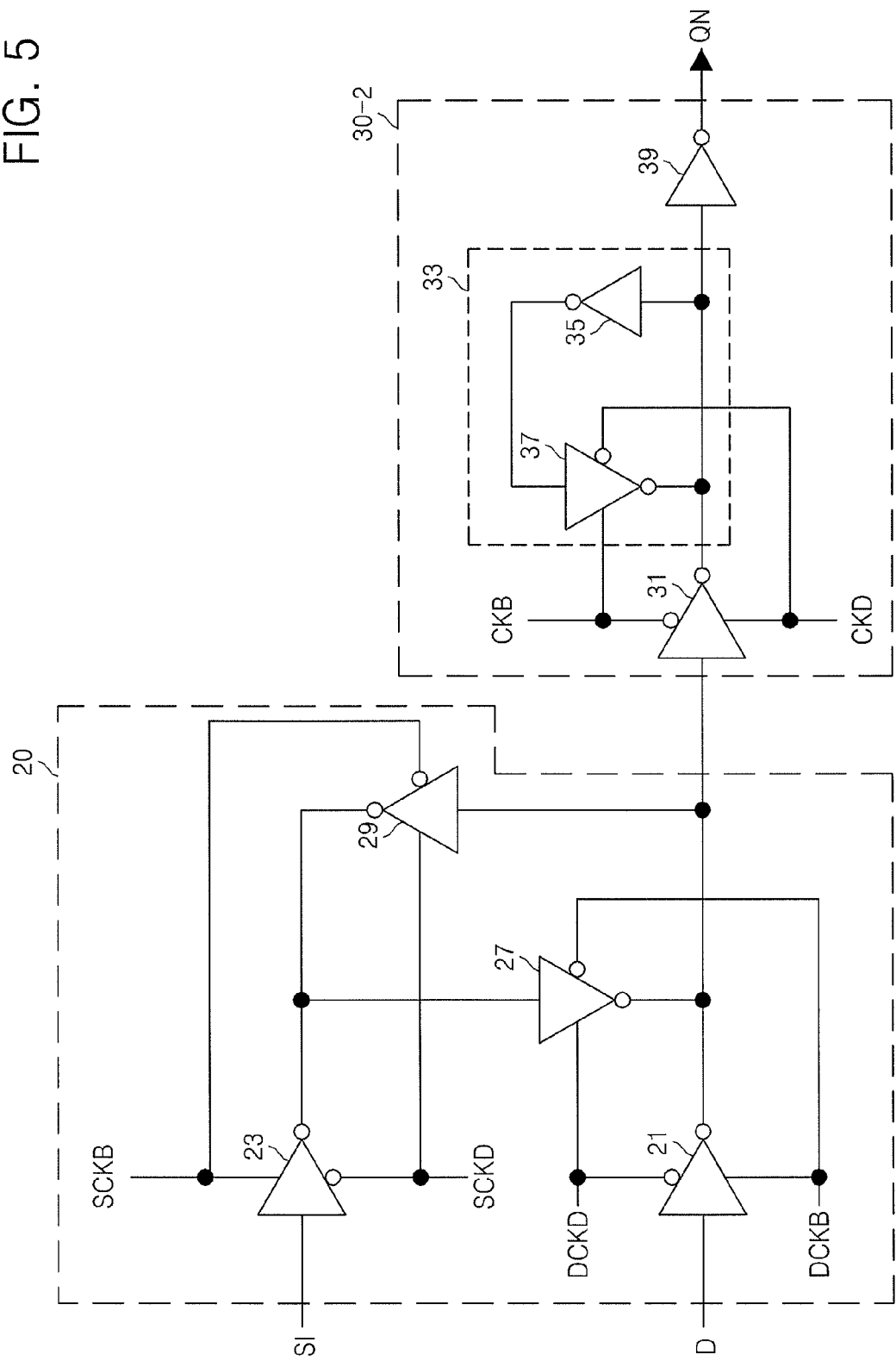
FIG. 5 illustrates a circuit diagram of exemplary embodiments of a first latch circuit and a second latch circuit.

FIG. 5 illustrates a circuit diagram of exemplary embodiments of the first latch circuit 20 and a second latch circuit 30-2. In general, only differences between the second latch circuit 30-1 of FIG. 2 and the second latch circuit 30-2 will be described below.

Referring to FIG. 5, the first latch circuit 20 corresponds to the first latch circuit 20 of FIG. 2, so its explanation will not be repeated. The second latch circuit 30-2 employs a clock signal CKD, e.g., a delayed clock, instead of the clock signal CK, and thus, explanation of features and operation of the second latch circuit 30-2 corresponds to those of the second latch circuit 30-1 and will not be repeated.

Figure 6:
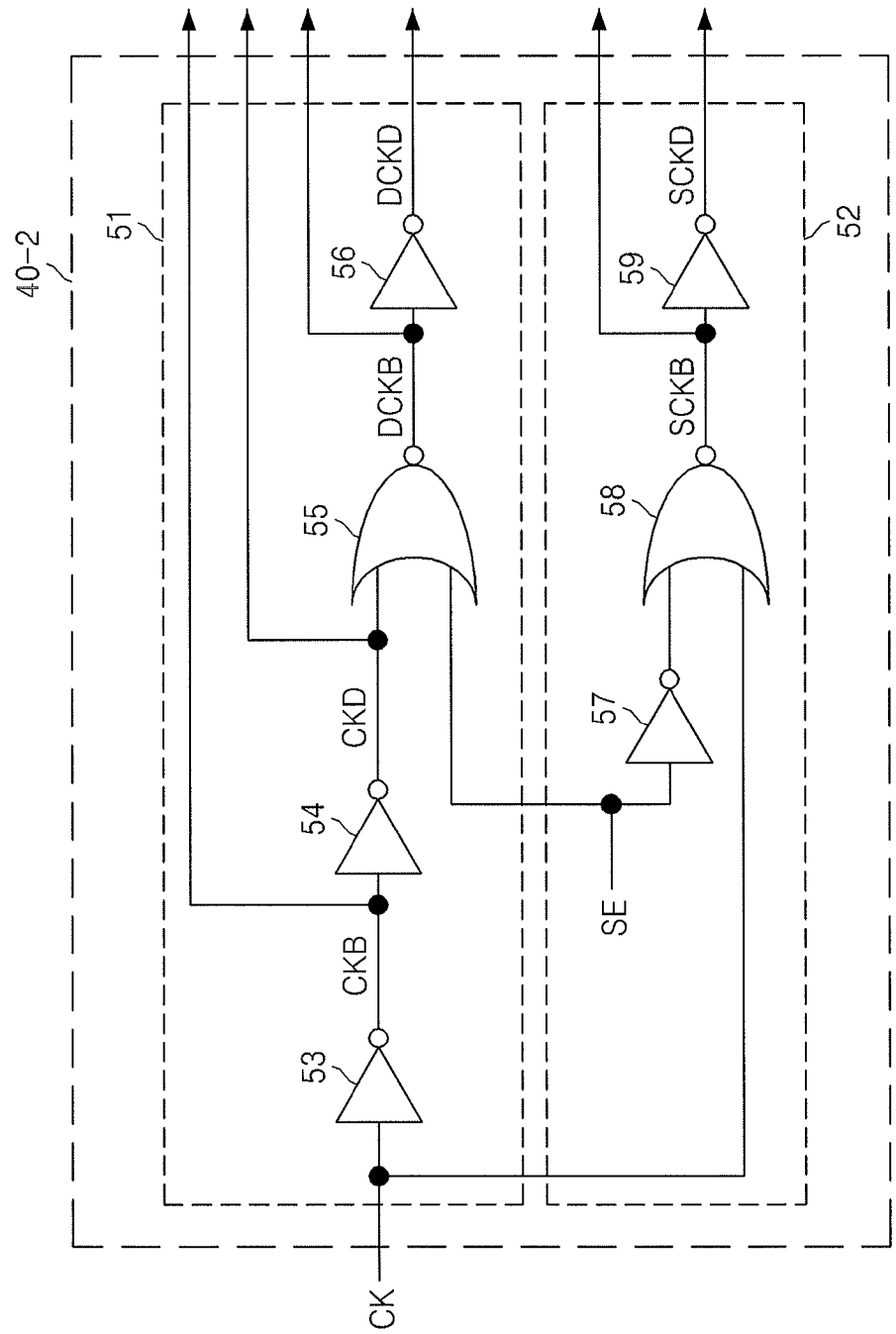
FIG. 6 illustrates a circuit diagram of an exemplary embodiment of a control signal generator.

FIG. 6 illustrates a circuit diagram of an exemplary embodiment of a control signal generator 40-2. In general, only differences between the control signal generator 40-1 of FIG. 2 and the control signal generator 40-2 of FIG. 6 will be described below.

The control signal generator 40-2 may include a first control signal generator 51 and a second control signal generator 52.

The first control signal generator 51 may generate a plurality of first control signal DCKD and DCKB by performing a logic combination on a clock signal CK and a scan enable signal SE.

The first control signal generator 51 may include a plurality of inverters 53, 54, 56 and a NOR gate 55. The first inverter 53 may output a clock signal CKB by inverting the clock signal CK. The second inverter 54 may output a clock signal CKD by inverting a clock signal CKB. The NOR gate 55 may output a control signal DCKB by performing a NOR operation on a scan enable signal SE and a clock signal CKD. The third inverter 56 may invert a control signal DCKB.

The second control signal generator 52 may generate a plurality of second control signals SCKD and SCKB by performing a logic combination on a clock signal CK and a scan enable signal SE.

The second control signal generator 52 may include a plurality of inverters 57, 59 and a NOR gate 58. The fourth inverter 57 may invert a scan enable signal SE. The NOR gate 58 may output a control signal SCKB by performing a NOR operation on an output signal of the fourth inverter 57 and a clock signal CK. The fifth inverter 59 may output a control signal SCKD by inverting a control signal SCKB. In one or more embodiments, the control signal generator 40-2 may include a combination of a plurality of NAND gates and/or a plurality of NOR gates.

Figure 7:
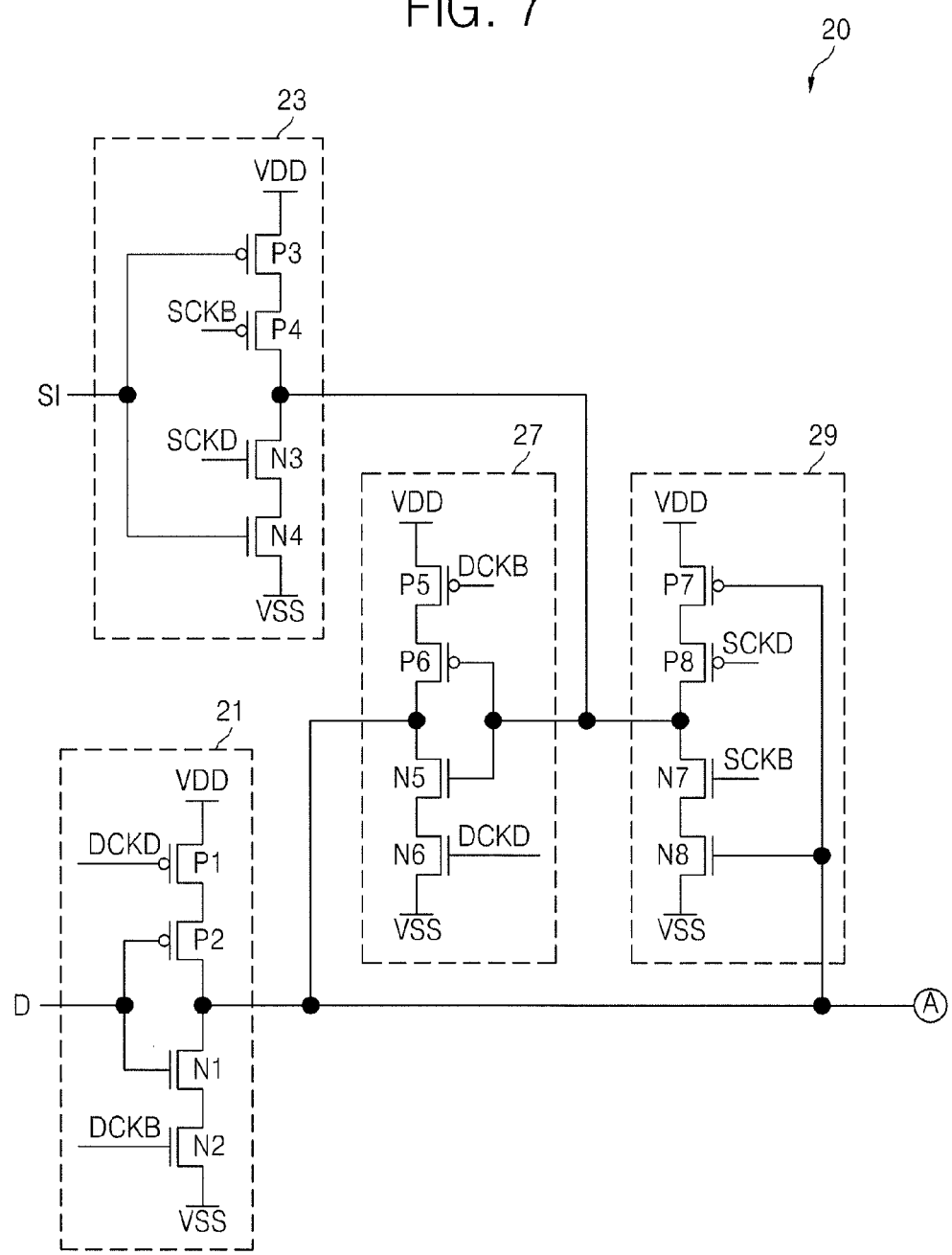
FIG. 7 illustrates a schematic diagram of an exemplary embodiment of the first latch circuit illustrated in FIG. 5.

FIG. 7 illustrates a schematic diagram of an exemplary embodiment of the first latch circuit 20 illustrated in FIG. 5.

Referring to FIGS. 1, 5, and 7, the first transmission circuit 21 includes a pair of PMOS transistors P1 and P2 and a pair of NMOS transistors N1 and N2 connected in series between a supply VDD and a ground VSS. A PMOS transistor P1 is controlled by a control signal DCKD. A PMOS transistor P2 and an NMOS transistor N1 are controlled by a data signal D. An NMOS transistor N2 is controlled by a control signal DCKB.

The second transmission circuit 23 may include a plurality of PMOS transistors P3 and P4 and a plurality of NMOS transistors N3 and N4 connected in series between the supply VDD and the ground VSS. A PMOS transistor P3 and an NMOS transistor N4 are controlled by a scan input signal SI. A PMOS transistor P4 is controlled by a control signal SCKB. An NMOS transistor N3 is controlled by a control signal SCKD.

The tri-state inverter 27 includes a pair of PMOS transistors P5 and P6 and a pair of NMOS transistors N5 and N6 connected in series between the supply VDD and the ground VSS. A PMOS transistor P5 is controlled by a control signal DCKB. A PMOS transistor P6 and an NMOS transistor N5 are controlled by an output signal of the second transmission circuit 23. An NMOS transistor N6 is controlled by a control signal DCKD.

The tri-state inverter 29 includes a pair of PMOS transistors P7 and P8 and a pair of NMOS transistors N7 and N8 connected in series between the supply VDD and the ground VSS. A PMOS transistor P7 and an NMOS transistor N8 are controlled by an output signal of the first transmission circuit 21. A PMOS transistor P8 is controlled by a control signal SCKD. An NMOS transistor N7 is controlled by a control signal SCKB.

Figure 8:
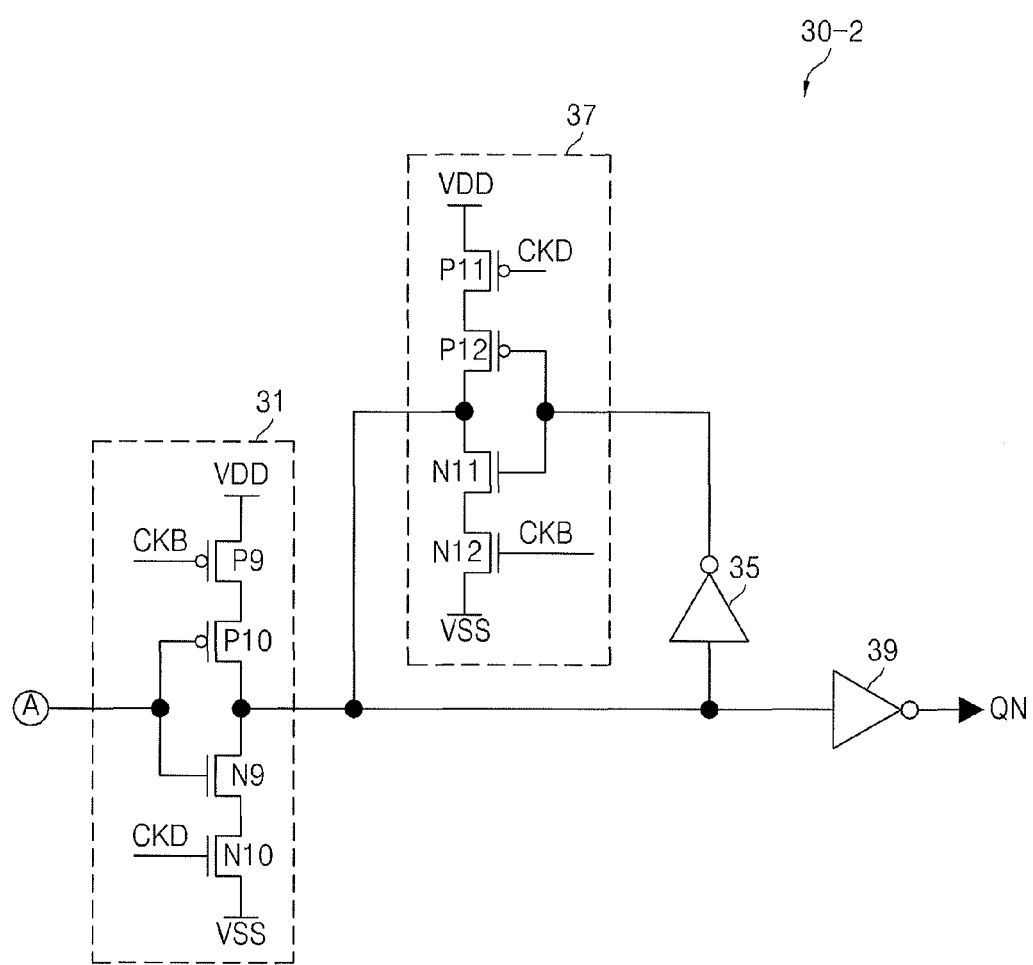
FIG. 8 illustrates a schematic diagram of an exemplary embodiment of the second latch circuit illustrated in FIG. 5.

FIG. 8 illustrates a schematic diagram of an exemplary embodiment of the second latch circuit 30-2 illustrated in FIG. 5.

Referring to FIGS. 1, 5 and 8, the tri-state inverter 31 includes a pair of PMOS transistors P9 and P10 and a pair of NMOS transistors N9 and N10 connected in series between the supply VDD and the ground VSS. A PMOS transistor P9 is controlled by a clock signal CKB. A PMOS transistor P10 and an NMOS transistor N9 are controlled by a signal D or SI output from the first latch circuit 20. An NMOS transistor N10 is controlled by a clock signal CKD.

The tri-state inverter 37 includes a pair of PMOS transistor P11 and P12 and a pair of NMOS transistors N11 and N12 connected in series between the supply VDD and the ground VSS. A PMOS transistor P11 is controlled by a clock signal CKD. A PMOS transistor P12 and an NMOS transistor N11 are controlled by an output signal of an inverter 35. An NMOS transistor N12 is controlled by a clock signal CKB.

Figure 9:
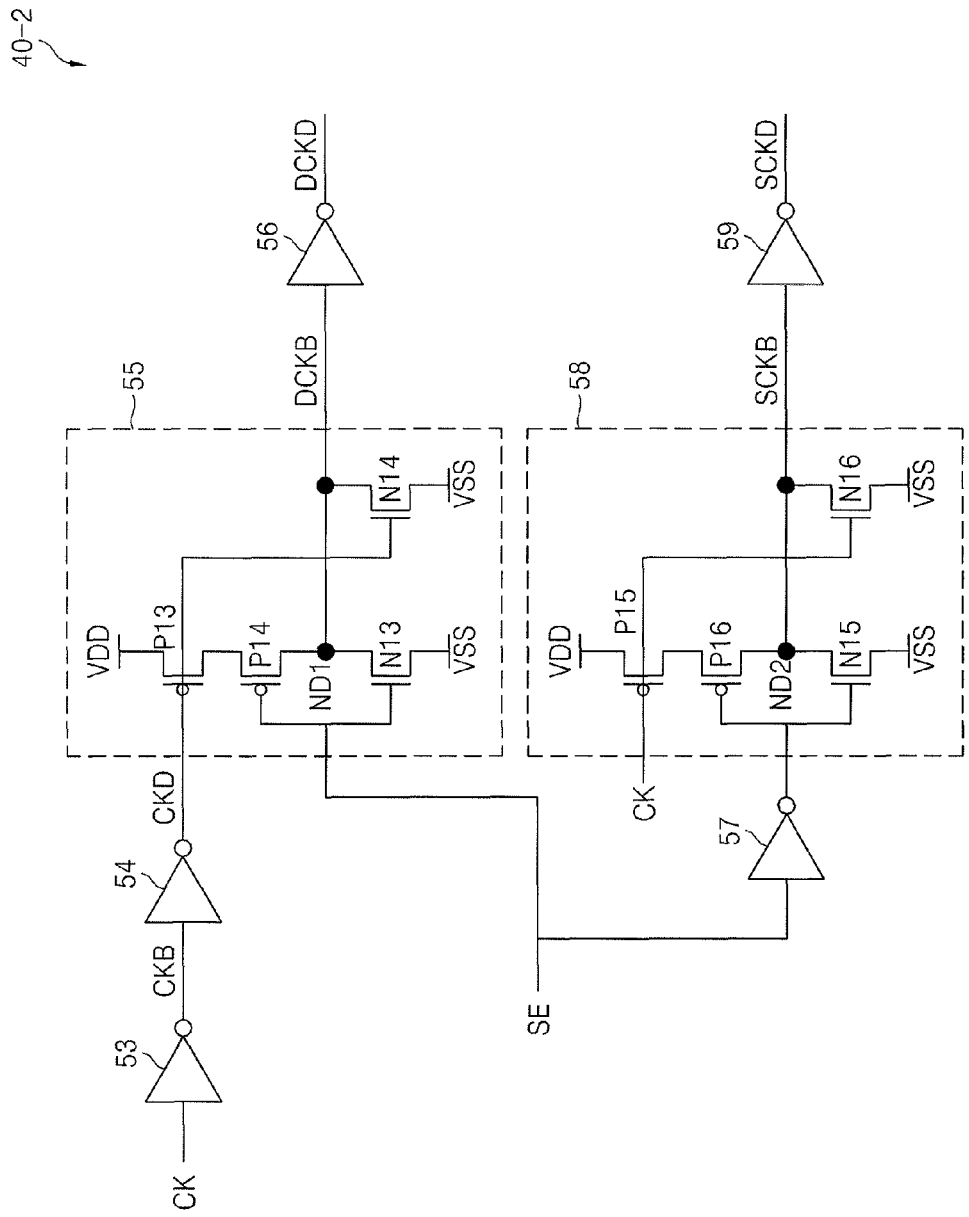
FIG. 9 illustrates a schematic diagram of the exemplary embodiment of the control signal generator illustrated in FIG. 6.

FIG. 9 illustrates a schematic diagram of the exemplary embodiment of the control signal generator 40-2 illustrated in FIG. 6.

Referring to FIGS. 1, 6 and 9, the NOR gate 55 includes a pair of PMOS transistors P13 and P14, which are connected in series between the supply VDD and a node ND1, and a pair of NMOS transistor N13 and N14, which are connected in parallel between the node ND1 and the ground VSS.

A PMOS transistor P13 and an NMOS transistor N14 are controlled by a clock signal CKD. A PMOS transistor P14 and an NMOS transistor N13 are controlled by a scan enable signal SE. The NOR gate 58 includes a pair of PMOS transistors P15 and 16 connected in series between the supply VDD and a node ND2 and a pair of NMOS transistors N15 and N16 connected in parallel between the node ND2 and the ground VSS.

A PMOS transistor P15 and an NMOS transistor N16 are controlled by a clock signal CK. A PMOS transistor P16 and an NMOS transistor N15 are controlled by a scan enable signal SE output from the inverter 57.

FIG. 10 illustrates a table depicting a simulation result based on a conventional flip-flop and a simulation result of an exemplary embodiment of a flip-flop employing one or more features described herein.

Referring to FIGS. 1, 4 and 10, a setup time TS is minimum time where a data signal D should be retained steadily before a clock signal CK. Time TCQ is delay time from the clock signal CK to the signal QN. Time TDQ is delay time from a data signal D to the signal QN. The time TDQ may be expressed as a sum of the setup time TS and the time TCQ.

Referring to FIG. 10, the time TCQ obtained from a conventional flip-flop is 81.93 ps and a time TCQ obtained from an exemplary embodiment of a flip-flop, e.g., 10 of FIG. 1, is 68.28 ps. The time TDQ obtained form a conventional flip-flop is 115.98 ps and the time TDQ of the exemplary embodiment of a flip-flop, e.g., 10, is 92.07ps. Accordingly, embodiments of a flip-flop including one or more features described herein, e.g., the flip-flop 10, provide a data signal D at higher speed by, e.g., reducing a signal transmission path.

Figure 11:
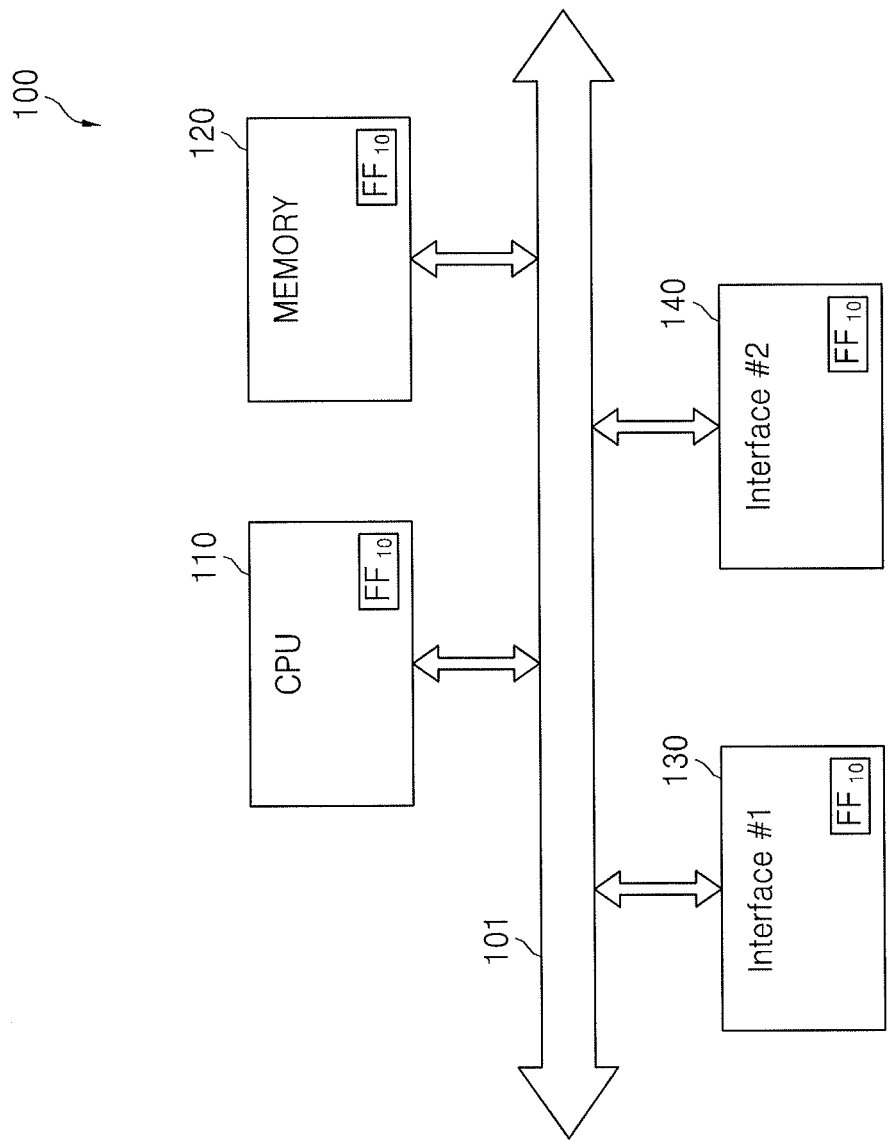
FIG. 11 illustrates a schematic block diagram of an exemplary embodiment of a semiconductor system including an exemplary embodiment of a flip-flop including one or more features described herein.

FIG. 11 illustrates a schematic block diagram of an exemplary embodiment of a semiconductor system including an exemplary embodiment of a flip-flop including one or more features described herein, e.g., flip-flop 10.

Referring to FIGS. 1 to 11, a semiconductor system 100 may be embodied in a PC, a portable computer, a cellular phone, a smart phone, a digital TV or a home automation device.

The semiconductor system 100 includes a CPU 110 and a memory 120 connected to each other through a system bus 101. The CPU 110 may control a whole operation of the memory 120. The CPU 110 includes the flip-flop 10 latching a signal processed by the CPU 110 and a logic circuit (not shown) controlling the flip-flop 10.

The memory 120 may be embodied in a non-volatile memory that may store a program code controlling an operation of the CPU 110, e.g., a read only memory (ROM), or embodied in a volatile memory which may store data, e.g., a dynamic random access memory (DRAM). The memory 120 includes the flip-flop 10 latching data accessed by the memory 120 and a logic circuit (not shown) controlling the flip-flop 10.

In one or more embodiments, the semiconductor system 100 may further include a first interface 130. The first interface 130 may be an input/output interface. The input/output interface may be an output device such as a monitor or a printer, or an input device such as a pointing device like a touch pad and a computer mouse, a keypad or a keyboard. The first interface 130 may include the flip-flop 10 latching data input/output by the first interface 130 and a logic circuit (not shown) controlling the flip-flop 10.

In one or more embodiments, the semiconductor system 100 may further include a second interface 140. The second interface 140 may be a communication interface for communicating with outside. For example, the communication interface may be a RF chip. The second interface 140 may include the flip-flop 10 latching data transmitted/received by the second interface 140 and a logic circuit (not shown) controlling the flip-flop 10.

One or more embodiments of a flip-flop including one or more features described herein supply data at high speed by reducing a signal transmission path as compared to conventional flip-flops.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A flip-flop, comprising:
   a first latch circuit configured to latch a data signal in response to a plurality of first control signals and to latch a scan input signal in response to a plurality of second control signals; and
   a second latch circuit configured to latch a signal output from the first latch circuit in response to complementary clock signals, wherein the first latch includes
   a first tri-state inverter configured to connect an input terminal of the second latch circuit and to invert the data signal in response to the first control signals;
   a second tri-state inverter configured to invert the scan input signal in response to the second control signals;
   a third tri-state inverter having an input terminal connected to an output terminal of the first tri-state inverter and having an output terminal connected to an output terminal of the second tri-state inverter; and
   a fourth tri-state inverter having an input terminal connected to the output terminal of the second tri-state inverter and having an output terminal connected to the output terminal of the first tri-state inverter.

2. The flip-flop as claimed in claim 1, wherein the third and fourth tri-state inverters form a latch unit configured to latch one of an output signal of the first tri-state inverter and an output signal of the second tri-state inverter in response to the first and second control signals.

3. The flip-flop as claimed in claim 1, wherein the plurality of first control signals are complementary to each other and the plurality of second control signals are complementary to each other.

4. The flip-flop as claimed in claim 1, wherein the flip-flop further comprises a control signal generator configured to generate the plurality of first control signals and the plurality of second control signals by performing a logic combination on one of the complementary clock signals and a scan enable signal.

5. The flip-flop as claimed in claim 4, wherein the control signal generator comprises:
a first control signal generator configured to generate the plurality of first control signals by performing a logic combination on the one of the complementary clock signals and the scan enable signal; and
a second control signal generator configured to generate the plurality of second control signals by performing a logic combination on the one of the complementary clock signals and the scan enable signal.

6. The flip-flop as claimed in claim 5, wherein the first control signal generator and the second control signal generator include a combination of a plurality of inverters and a plurality of NAND gates.

7. The flip-flop as claimed in claim 5, wherein the first control signal generator comprises:
a first inverter configured to output the other of the complementary clock signals by inverting the one of the complementary clock signals;
a second inverter configured to invert the scan enable signal;
a NAND gate configured to perform a NAND operation on an output signal of the first inverter and an output signal of the second inverter; and
a third inverter configured to invert an output signal of the first NAND gate.

8. The flip-flop as claimed in claim 5, wherein the second control signal generator comprises:
a NAND gate configured to perform a NAND operation on the scan enable signal and a clock signal inverting the one of the complementary clock signals; and
an inverter configured to invert an output signal of the first NAND gate.

9. The flip-flop as claimed in claim 5, wherein the first control signal generator and the second control signal generator include a combination of a plurality of inverters and a plurality of NOR gates.

10. The flip-flop as claimed in claim 5, wherein the first control signal generator comprises:
a first inverter configured to invert the one of the complementary clock signals;
a second inverter configured to invert an output signal of the first inverter;
a NOR gate configured to perform a NOR operation on the scan enable signal and an output signal of the second inverter; and
a third inverter configured to invert an output signal of the NOR gate.

11. The flip-flop as claimed in claim 5, wherein the second control signal generator comprises:
a first inverter configured to invert the scan enable signal;
a NOR gate configured to perform a NOR operation on the one of the complementary clock signals and an output signal of the first inverter signal; and
a second inverter configured to invert an output signal of the NOR gate.

12. The flip-flop as claimed in claim 1, wherein the second latch circuit includes:
a fifth tri-state inverter configured to receive the signal output from the first latch circuit;
a latch unit configured to latch the signal output from the first latch circuit based on the complementary clock signals; and
an inverter configured to invert the signal output from the latch unit.

13. The flip-flop as claimed in claim 12, wherein the fifth tri-state inverter is configured to invert the signal output from the first latch circuit based on the complementary clock signals.

14. The flip-flop as claimed in claim 13, wherein the latch unit includes an inverter and a sixth tri-state inverter.

15. A semiconductor device, comprising:
a flip-flop; and
a logic circuit controlling the flip-flop,
wherein the flip-flop includes:
a first latch circuit configured to latch a data signal in response to a plurality of first control signals and to latch a scan input signal in response to a plurality of second control signals; and
a second latch circuit configured to latch a signal output from the first latch circuit in response to complementary clock signals, wherein the first latch includes
a first tri-state inverter configured to connect an input terminal of the second latch circuit and to invert the data signal in response to the first control signals;
a second tri-state inverter configured to invert the scan input signal in response to the second control signals;
a third tri-state inverter having an input terminal connected to an output terminal of the first tri-state inverter and having an output terminal connected to an output terminal of the second tri-state inverter; and
a fourth tri-state inverter having an input terminal connected to the output terminal of the second tri-state inverter and having an output terminal connected to the output terminal of the first tri-state inverter.

16. The semiconductor device as claimed in claim 15, wherein the
third and fourth tri-state inverters form a latch unit configured to latch one of an output signal of the first tri-state inverter and an output signal of the second tri-state inverter in response to the first and second control signals.

17. A flip-flop, comprising:
a first latch circuit configured to latch a data signal in response to a plurality of first control signals and latch a scan input signal in response to a plurality of second control signals;
a second latch circuit configured to latch a signal output from the first latch circuit in response to complementary clock signals, and
a driver configured to supply the first control signals, the second control signals and the complementary clock signals such that the first latch circuit and the second latch circuit are transparent during a same period of time, wherein the first latch includes
a first tri-state inverter configured to connect an input terminal of the second latch circuit and to invert the data signal in response to the first control signals;
a second tri-state inverter configured to invert the scan input signal in response to the second control signals;
a third tri-state inverter having an input terminal connected to an output terminal of the first tri-state inverter and having an output terminal connected to an output terminal of the second tri-state inverter; and
a fourth tri-state inverter having an input terminal connected to the output terminal of the second tri-state inverter and having an output terminal connected to the output terminal of the first tri-state inverter.

18. The flip-flop as claimed in claim 17, wherein:
the:
- third and fourth tri-state inverters form a latch unit configured to latch one of an output signal of the first tri-state inverter and an output signal of the second tri-state inverter in response to the first and second control signals; and the second latch circuit includes:
- a tri-state inverter configured to receive the signal output from the first latch circuit,
- a second latch unit configured to latch the signal output from the first latch circuit based on the complementary clock signals, and
- an inverter configured to invert the signal output from the second latch unit, and the first latch circuit is transparent when the data signal passes only through the first transmission circuit of the first latch circuit, and the second latch circuit is transparent when the signal output from the first latch circuit passes only through the tri-state inverter.

* * * * *